(12) United States Patent
Kim

(10) Patent No.: US 11,911,811 B2
(45) Date of Patent: Feb. 27, 2024

(54) APPARATUS FOR CLEANING DEPOSITION MASK AND METHOD OF CLEANING DEPOSITION MASK

(71) Applicant: Samsung Display Co., Ltd., Yongin-Si (KR)

(72) Inventor: Myungkyu Kim, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/839,766

(22) Filed: Jun. 14, 2022

(65) Prior Publication Data

US 2022/0305531 A1    Sep. 29, 2022

Related U.S. Application Data

(62) Division of application No. 15/990,866, filed on May 29, 2018, now Pat. No. 11,389,839.

(30) Foreign Application Priority Data

May 30, 2017    (KR) .................. 10-2017-0067061

(51) Int. Cl.
*B08B 7/00* (2006.01)
*C23C 14/04* (2006.01)

(52) U.S. Cl.
CPC .......... *B08B 7/0042* (2013.01); *B08B 7/0035* (2013.01); *C23C 14/042* (2013.01)

(58) Field of Classification Search
CPC .... B08B 7/0042; B08B 7/0035; C23C 14/042
(Continued)

(56) References Cited

U.S. PATENT DOCUMENTS 6,492,616 B1    12/2002    Tanaka ................. H01L 21/481
                                            219/121.71
6,924,492 B2    8/2005    Van Schaik
(Continued)

FOREIGN PATENT DOCUMENTS

JP    2011195872 A  * 10/2011
KR    100767837 B1    10/2007
(Continued)

OTHER PUBLICATIONS

Machine Translation, JP 2011-195872 (Year: 2011).*
Machine translation, TW 201428275 (Year: 2014).

*Primary Examiner* — Michael G Miller
(74) *Attorney, Agent, or Firm* — CANTOR COLBURN LLP

(57) ABSTRACT

An apparatus for cleaning a mask includes a chamber in which material deposition is performable on a substrate using the mask, the chamber including a transmission window through which light used in cleaning the mask within the chamber is irradiated into the chamber from outside thereof; within the chamber: a stage on which the substrate is disposed, the stage disposed in a plane defined by first and second directions crossing each other; and a material deposition unit from which a deposition material is provided to the substrate; and a light irradiation unit from which is provided the light used in cleaning the mask within the chamber. The light irradiation unit is disposed outside the chamber and irradiates the light into the chamber through the transmission window. The material deposition unit disposed within the chamber and the light irradiation unit disposed outside the chamber are reciprocally movable in the first direction.

4 Claims, 11 Drawing Sheets

(58) Field of Classification Search
USPC .................. 118/715–733; 427/248.1–255.7
See application file for complete search history.

(56) References Cited

U.S. PATENT DOCUMENTS

| | | | |
|---|---|---|---|
| 9,174,250 B2 | 11/2015 | Lee | ................. B08B 7/0035 |
| 2003/0124764 A1 | 7/2003 | Yamazaki | ............... B05D 1/60 |
| | | | 438/99 |
| 2012/0301986 A1* | 11/2012 | Choi | ................. C23C 14/50 |
| | | | 118/301 |
| 2015/0107617 A1 | 4/2015 | Lee et al. | |

FOREIGN PATENT DOCUMENTS

| | | | |
|---|---|---|---|
| KR | 100989071 B1 | 10/2010 | |
| KR | 101195565 B1 | 10/2012 | |
| KR | 101210481 B1 | 12/2012 | |
| KR | 1020150044765 A | 4/2015 | |
| TW | 201428275 A | 7/2014 | ........... G01N 21/956 |

* cited by examiner

APPARATUS FOR CLEANING DEPOSITION MASK AND METHOD OF CLEANING DEPOSITION MASK

This application is a divisional application of U.S. application Ser. No. 15/990,866 filed May 29, 2018, which claims priority to Korean Patent Application No. 10-2017-0067061, filed on May 30, 2017, and all the benefits accruing therefrom under 35 U.S.C. § 119, the content of which in its entirety is herein incorporated by reference.

BACKGROUND

1. Field

Embodiments of the invention relate to an apparatus for cleaning a mask used for deposition and a method of cleaning the mask and, more particularly, to an apparatus for cleaning a mask used for deposition and a method of cleaning the mask, which are capable of reducing a time and a cost and of reducing a failure rate.

2. Description of the Related Art

A mask through which a pattern material is deposited is used as a key component for forming precise patterns on a substrate. In particular, in processes of manufacturing electronic component devices, a precisely patterned mask may be disposed very close to or in contact with the substrate, and patterns of the mask formed from pattern material passed therethrough may be transferred onto the substrate to define predetermined patterns on the substrate.

Before the mask is reused, a cleaning process should be performed on the mask to form precise patterns in subsequent uses of the mask. The mask may be cleaned by a chemical wet cleaning method or a method using laser or ultrasonic waves.

SUMMARY

One or more embodiment of the present disclosure may provide an apparatus for cleaning a mask, which is capable of reducing a time, a cost and a failure rate.

Embodiments of the invention may also provide an apparatus for cleaning a mask, which can simultaneously perform a deposition process and a cleaning process within the chamber.

In an embodiment, an apparatus for cleaning a deposition mask includes a chamber in which material deposition is performable on a substrate using the deposition mask, the chamber including a transmission window through which light used in cleaning the deposition mask within the chamber is irradiated into the chamber from outside thereof; within the chamber: a stage on which the substrate is disposed for the material deposition using the deposition mask, the stage disposed in a plane defined by first and second directions which cross each other; and a material deposition unit from which a deposition material for the material deposition is provided to the substrate on the stage via the deposition mask; and a light irradiation unit from which is provided the light used in cleaning the deposition mask within the chamber, where the light irradiation unit is disposed outside the chamber and irradiates the light used in cleaning the deposition mask into the chamber through the transmission window. The material deposition unit disposed within the chamber and the light irradiation unit disposed outside the chamber are reciprocally movable in the first direction.

The apparatus may further include a reflection member with which the light used in cleaning the deposition mask within the chamber is reflected to the deposition mask from the light irradiation unit.

The reflection member may be connected to the material deposition unit to be reciprocally movable in the first direction.

The apparatus may further include a first angle adjustment unit connected to the reflection member and with which the reflection member is tiltable.

The reflection member may be rotatable about the first angle adjustment unit.

The chamber may include a cover portion including a bottom surface on which the stage is disposed, a bottom portion being opposite to the cover portion and including a first guide rail extending in the first direction, and a plurality of sidewall portions connecting the bottom portion and the cover portion to each other. One of the sidewall portions may include the transmission window, and the material deposition unit and the reflection member may together be reciprocally movable along the first guide rail in the first direction.

The apparatus may further include a first moving member connected to a bottom surface of the material deposition unit and engageable with the first guide rail of the chamber, the first moving member reciprocally movable along the first guide rail in the first direction.

The apparatus may further include a top surface of the reflection member facing the deposition mask; and a shutter disposed on the reflection member and with which a partial area of a top surface of the reflection member is covered. The shutter may be movable on the reflection member, and the light used in cleaning the deposition mask which is irradiated through the transmission window is incident to a remaining area of the top surface of the reflection member, which is exposed by the shutter.

The apparatus may further include the reflection member provided in plurality within the chamber, and the light irradiation unit provided in plurality outside the chamber, from which is provided the light used in cleaning the deposition mask within the chamber to the reflection members in one-to-one correspondence. The chamber may further include the transmission window provided in plurality corresponding to the plurality of light irradiation units, respectively, and the light irradiation units may be opposite to each other with the chamber interposed therebetween.

The reflection members may be tilted in different directions from each other.

The reflection members may be arranged in the first direction.

The material deposition unit and the light irradiation unit may be reciprocally movable in the first direction at the same speed.

The light irradiation unit may irradiate a laser beam as the light used in cleaning the deposition mask within the chamber.

The apparatus may further include a guide substrate outside of the chamber at a side thereof at which the transmission window is disposed. The guide substrate may include a second guide rail extending in the first direction, and the light irradiation unit may be reciprocally movable along the second guide rail in the first direction.

The apparatus may further include a second moving member which is connected to a bottom surface of the light irradiation unit and engageable with the second guide rail of the guide substrate, the second moving member reciprocally movable along the second guide rail in the first direction.

The apparatus may further include a second angle adjustment unit connected to the light irradiation unit and with which the light irradiation unit is tiltable a predetermined angle.

In another embodiment, a method of cleaning a deposition mask includes disposing a substrate and the deposition mask on a stage within a chamber in which material deposition is performable on the substrate using the deposition mask; depositing a deposition material on an area of a top surface of the substrate which is exposed by the deposition mask and on a top surface of the deposition mask; and cleaning the deposition material from the top surface of the deposition mask by using light provided from a light irradiation unit disposed outside the chamber. The depositing of the deposition material and the cleaning of the deposition material are each performed in a vacuum state within the chamber.

The depositing the deposition material and the cleaning of the deposition material may be performed simultaneously.

The depositing of the deposition material may include a material deposition unit providing the deposition material, the material deposition unit disposed in the chamber. The cleaning of the deposition material may include setting an angle of a reflection member disposed in the chamber and connected to the material deposition unit, providing the light onto the reflection member within the chamber from the light irradiation unit outside the chamber and the reflection member reflecting the light provided thereto from the light irradiation unit disposed outside the chamber to the deposition mask within the chamber.

The depositing of the deposition material may include a material deposition unit providing the deposition material, the material deposition unit disposed in the chamber. The cleaning of the deposition material may include setting a direction of light which will be provided from the light irradiation unit, providing the light from the light irradiation unit outside the chamber onto a reflection member disposed inside the chamber and connected to the material deposition unit, and the reflection member reflecting the light provided thereto from the light irradiation unit disposed outside the chamber to the deposition mask within the chamber.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
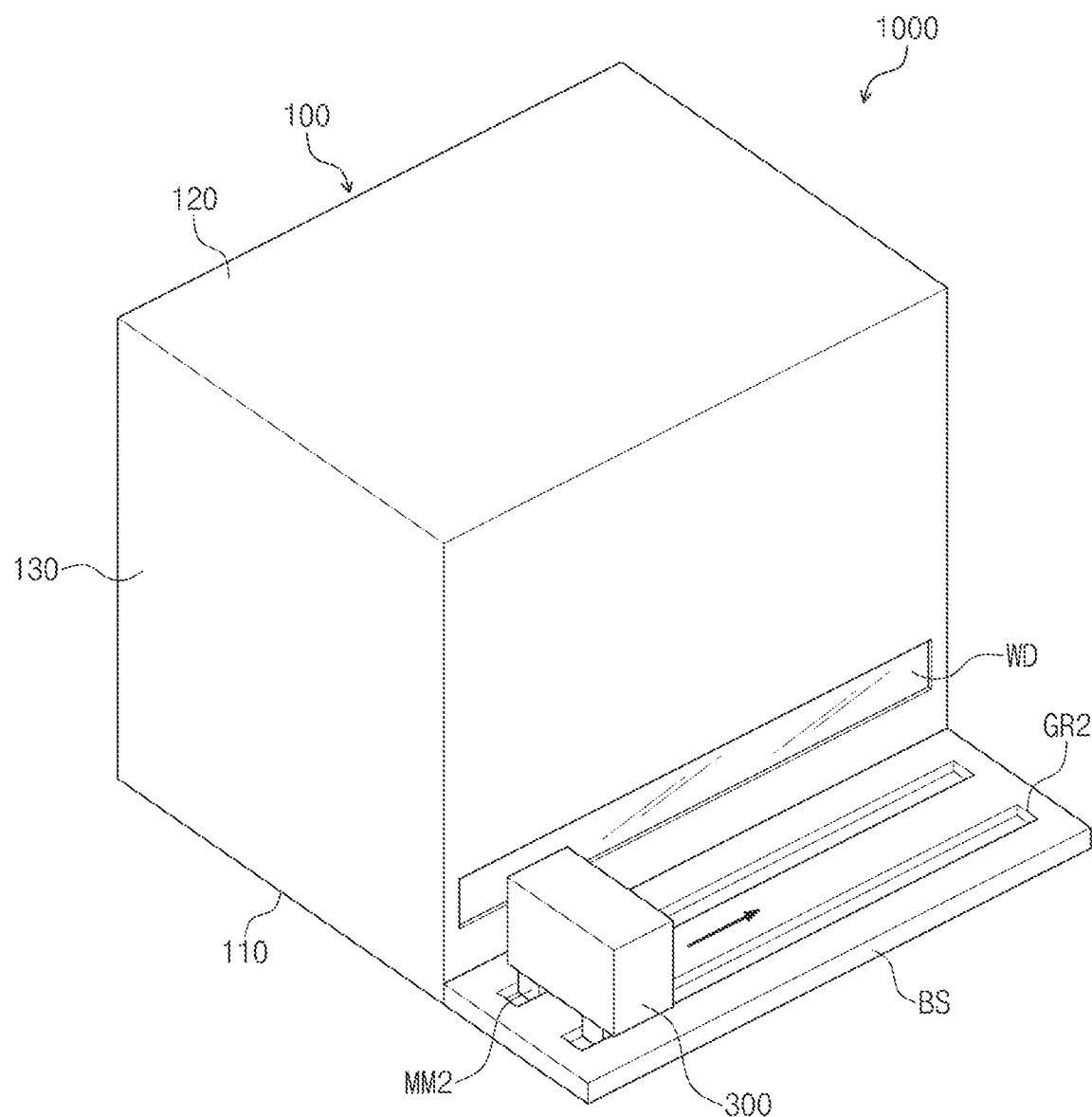
FIG. 1 is a perspective view illustrating an exemplary embodiment of an apparatus for cleaning a mask, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being related to another element such as being "on" another element, it can be directly on the other element or intervening elements may be present. In contrast, the term "directly" means that there are no intervening elements.

As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above" "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the invention will be described in detail with reference to the accompanying drawings.

Figure 2:
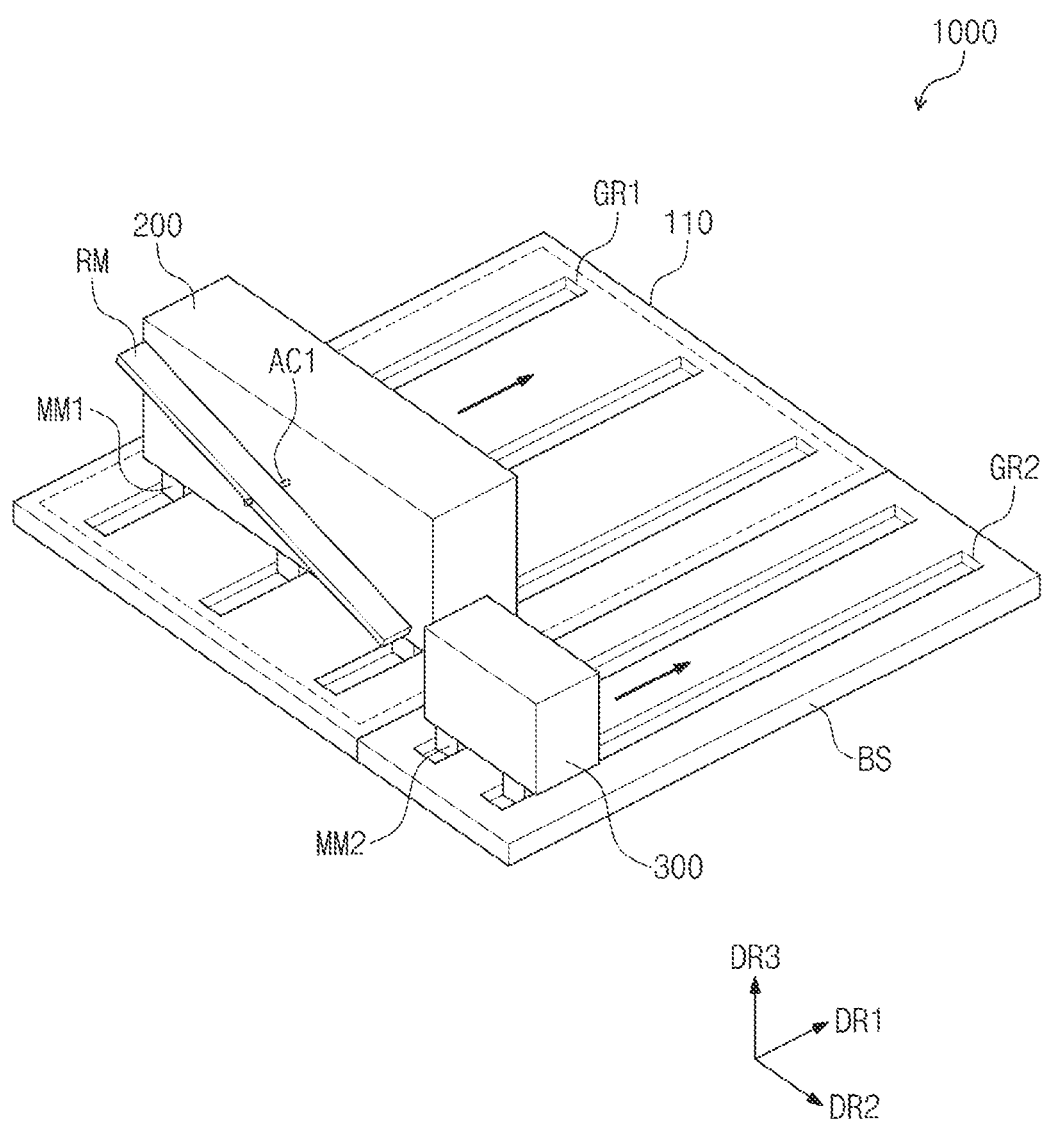
FIG. 2 is a perspective view illustrating an exemplary embodiment of the apparatus for cleaning a mask, which is illustrated in FIG. 1, from which illustration of a sidewall portion of a chamber is omitted.
Figure 3:
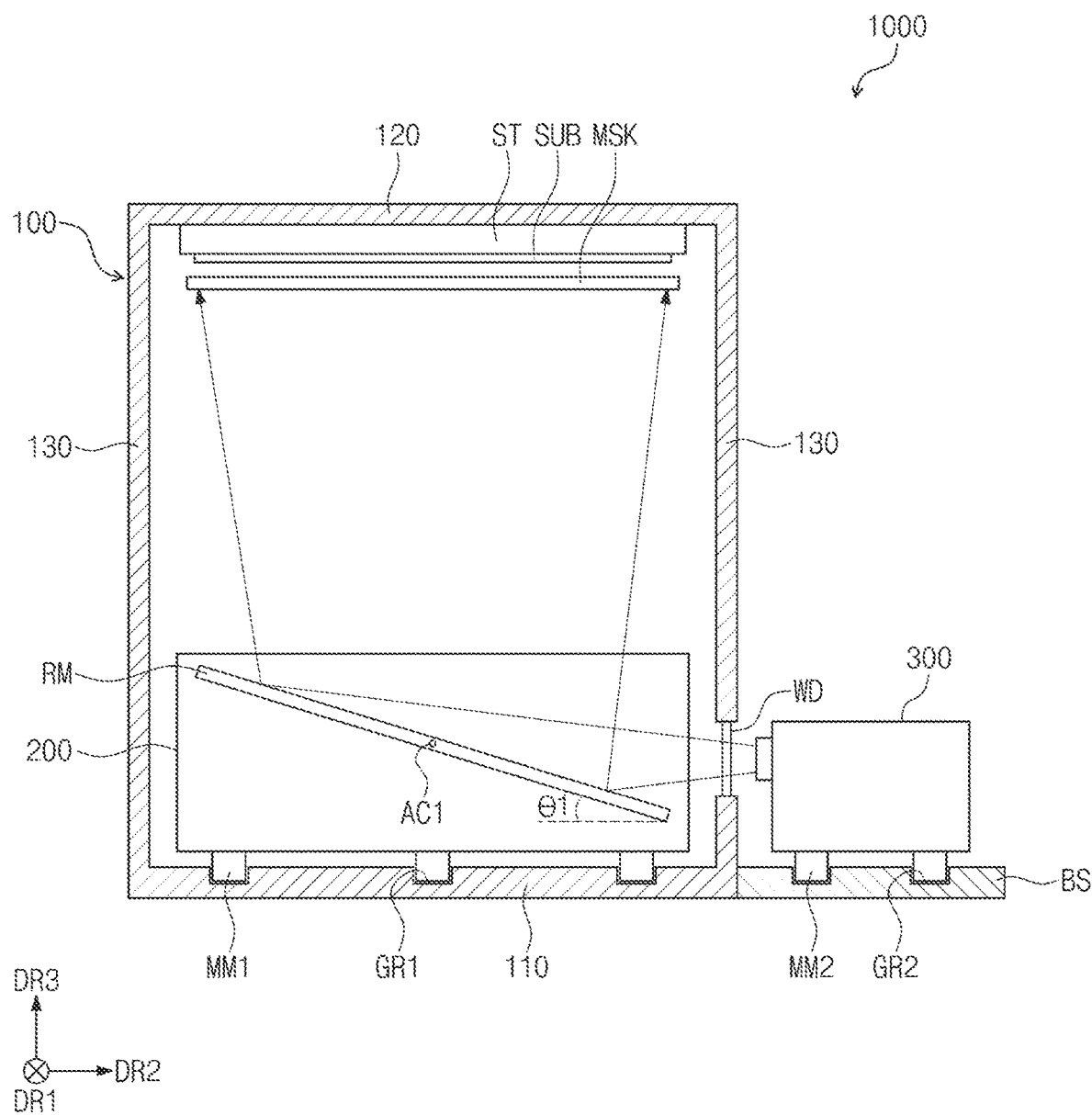
FIG. 3 is a front cross-sectional view illustrating the apparatus for cleaning a mask, which is illustrated in FIG. 1.

FIGS. 1 and 2 are perspective views illustrating an apparatus for cleaning a mask, according to an embodiment of the invention, and FIG. 3 is a front view illustrating the apparatus for cleaning a mask, which is illustrated in FIG. 1. A portion of a chamber is omitted in FIG. 2 for the purpose of ease and convenience in description and illustration.

Referring to FIGS. 1 to 3, an apparatus 1000 for cleaning a mask (hereinafter, referred to as 'a mask cleaning apparatus') according to an embodiment of the invention may include a chamber 100, a stage ST, a deposition unit 200, a reflection member RM and an irradiation unit 300.

Within the chamber 100, a deposition material for forming a relatively precise or fine pattern may be deposited onto a substrate, such as by the deposition material passing through a deposition mask having a deposition pattern corresponding to the precise or fine pattern to be formed. The chamber 100 is maintained in a relatively high vacuum state to reduce or effectively prevent a foreign material from flowing from outside the chamber 100 into the inside of the chamber 100 and to ensure relatively straight movement of a deposition material within the chamber 100. In an exemplary embodiment, for example, a vacuum degree of the chamber 100 may be about 10 E-7 Torr or less.

The chamber 100 may have an overall hexahedral shape. However, embodiments of the invention are not limited thereto. In certain embodiments, the shape of the chamber 100 may be variously modified.

In more detail, the chamber 100 includes a bottom portion 110, a cover portion 120 and a plurality of sidewall portions 130. The bottom portion 110 is disposed at the lowermost end of the chamber 100. The cover portion 120 is opposite to the bottom portion 110. The sidewall portions 130 are disposed between the bottom portion 110 and the cover portion 120 to each connect the bottom portion 110 and the cover portion 120 to each other.

The bottom portion 110 includes at least one first guide rail (member) GR1 disposed or formed at a top surface of the bottom portion 110. In the present embodiment, three first guide rails GR1 are illustrated. However, embodiments of the invention are not limited to the number of the first guide rails GR1.

Each of the first guide rails GR1 lengthwise extends in a first direction DR1. The first guide rails GR1 are parallel to each other.

In the present embodiment, the first guide rail GR1 has an engraved shape formed by a recess that is recessed downward from the top surface of the bottom portion 110. However, embodiments of the invention are not limited to the shape of the first guide rail GR1. In other embodiments, the first guide rail GR1 may have an embossed shape formed by a protruded portion that protrudes upward from the top surface of the bottom portion 110, such as toward the cover portion 120.

According to the present embodiment, at least one of the sidewall portions 130 may include a transmission window WD. In more detail, according to the present embodiment, the transmission window WD may be included in one sidewall portion 130 corresponding to a side of the chamber 100 disposed furthest in a second direction DR2. The second direction DR2 is parallel to the bottom portion 110 and intersects the first direction DR1. The bottom portion 110 may be disposed in a plane defined by the first and second directions DR1 and DR2 which cross each other.

In the present embodiment, the chamber 100 includes a single transmission window WD. However, embodiments of the invention are not limited to the number and the position of the transmission window WD. According to other embodiments, the transmission window WD may be provided in plurality or may be included in another among the sidewall portions 130 of the chamber 100.

The transmission window WD includes a material having a relatively high transmittance. In an exemplary embodiment, for example, the transmission window WD may include a glass material. The transmission window WD may lengthwise extend in the first direction DR1 on the sidewall portion 130.

The stage ST is disposed under the cover portion 120 or on a bottom surface of the cover portion 120. A substrate SUB on which a pattern is to be formed may be placed on the stage ST. A mask MSK may be disposed relatively close to the substrate SUB. The mask MSK may have a deposition pattern defined therein, such as by solid portions thereof and open portions thereof.

The deposition unit 200 is disposed in a lower region of an inner space of the chamber 100. The deposition unit 200 provides a deposition material to the substrate SUB. Referring to FIG. 3, portions of a lower surface of the substrate SUB may be exposed to the deposition unit 200 through the open portions of the mask MSK. In other words, the deposition unit 200 may deposit the deposition material to an area of the substrate SUB exposed by the mask MSK.

In more detail, the inside of the deposition unit 200 may include or be filled with the deposition material (e.g., an organic material and/or a metal) which will be deposited on the substrate SUB. In an exemplary embodiment, for example, in the event that the deposition material deposited on the substrate SUB is the organic material, an organic thin layer may be formed on the substrate SUB.

In the present embodiment, the deposition unit 200 may evaporate the deposition material to provide the deposition material to the substrate SUB. In an exemplary embodiment, for example, the deposition unit 200 may include a furnace (not shown) in which the deposition material is disposed, heater units (not shown) heating the deposition material, and a plurality of nozzles (not shown) injecting the deposition material from the deposition unit 200 to outside thereof (e.g., to the inner space of the chamber 100).

The deposition unit 200 further includes at least one first moving member MM1 disposed on a bottom surface of the deposition unit 200 to be connected thereto. The first moving member MM1 is engageable with the first guide rail GR1 to be movable relative thereto. In an exemplary embodiment, for example, the first moving member MM1 may include a wheel. The deposition unit 200 may be reciprocatable along the first direction DR1 by the first moving member MM1 connected thereto being engaged with and moved along the first guide rail GR1. In the present embodiment, the first moving member MM1 may be provided in plurality, and the first moving members MM1 may be respectively engaged with the first guide rails GR1.

When the first guide rail GR1 has the embossed shape in other embodiments as described above, the first moving member MM1 may be omitted and a groove having an engraved shape may be formed at the bottom surface of the deposition unit 200. In other words, the groove of the deposition unit 200 may be engageable with the first guide rail GR1 such that the deposition unit 200 is movable relative to the bottom portion 110 of the chamber 100.

The reflection member RM is connected to the deposition unit 200 to be reciprocatable in the first direction DR1. The reflection member RM may be movable simultaneously with the deposition unit 200. The reflection member RM is disposed outside the deposition unit 200. The reflection member RM includes a material having a relatively high reflectance. In an exemplary embodiment, for example, the reflection member RM may be a mirror. As illustrated in FIG. 3, the reflection member RM reflects incident light toward the mask MSK.

According to the present embodiment, the mask cleaning apparatus 1000 may further include a first angle adjustment unit AC1. The first angle adjustment unit AC1 connects the reflection member RM to the deposition unit 200.

In more detail, the first angle adjustment unit AC1 connects a central portion of the reflection member RM to the deposition unit 200. The reflection member RM may be rotatable about the first angle adjustment unit AC1. Since the reflection member RM is rotatable, a direction of light incident on the reflection member RM may be controlled or adjusted. According to the present embodiment, the reflection member RM forms a first angle θ1 with a plane parallel to that in which the bottom portion 110 is disposed.

In the present embodiment, the reflection member RM is connected to the deposition unit 200, and thus the reflection member RM and the deposition unit 200 are moved together in the first direction DR1. However, embodiments of the invention are not limited thereto. Even though not shown in the drawings, in other embodiments, the reflection member RM and the deposition unit 200 may be unconnected from each other, and thus the reflection member RM and the deposition unit 200 may be moved independently of each other.

The irradiation unit 300 is disposed outside the chamber 100. In more detail, the irradiation unit 300 is disposed adjacent to a side of the chamber 100 in the second direction DR2. The transmission window WD is provided in the sidewall portion 130, corresponding to the side of the chamber 100 at which the irradiation unit 300 is disposed, among the sidewall portions 130. The irradiation unit 300 generates and provides light to the reflection member RM, disposed in the chamber 100, through the transmission window WD.

The irradiation unit 300 may be movable in the first direction DR1, such along a length of the transmission window WD. According to the present embodiment, the irradiation unit 300 may be movable outside the chamber 100 along the first direction DR1 at the same speed as the deposition unit 200 is movable inside the chamber 100. In an exemplary embodiment, as being movable at the same speed as each other, the irradiation unit 300 may be movable in the first direction DR1 in a state in which the irradiation unit 300 is disposed on the same (virtual) line as (or is aligned with) the reflection member RM along the second direction DR2.

According to the present embodiment, the light provided by the irradiation unit 300 may be a laser beam. In more detail, even though not shown in the drawings, the irradiation unit 300 may include a laser generator (not shown) generating the laser beam, and a laser irradiation part (not shown) receiving the laser beam from the laser generator (not shown) and transmitting the laser beam into the chamber 100. The laser irradiation part (not shown) may include lenses and/or mirrors which adjust a direction and/or a magnitude of the laser beam.

According to the present embodiment, the laser generator (not shown) and the laser irradiation part (not shown) may be integrated with each other as a single unitary body. However, embodiments of the invention are not limited thereto. According to another embodiment of the invention, the laser generator (not shown) and the laser irradiation part (not shown) may be separated from each other. In this case, the laser generator (not shown) may not be movable in the first direction DR1 but only the laser irradiation part (not shown) may be movable in the first direction DR1 such as to move simultaneously with the deposition unit 200.

According to the present embodiment, the irradiation unit 300 is disposed outside the chamber 100, not inside the chamber 100. Thus, it may be easy to control an optical system included in the laser irradiation part (not shown) of the irradiation unit 300.

Even though not shown in the drawings, the reflection member RM may be omitted in other embodiments. In these cases, the irradiation unit 300 may provide the laser beam directly to the mask MSK through the transmission window WD.

In still other embodiments, the moving direction of the reflection member RM and the irradiation unit 300 may be different from the moving direction of the deposition unit 200. In an exemplary embodiment, for example, the reflection member RM and the irradiation unit 300 may be movable in the first direction DR1, and the deposition unit 200 may be movable in the second direction DR2.

In yet other embodiments, one of the deposition unit 200 and the reflection member RM may not be movable and may be in a fixed position. In an exemplary embodiment, for example, the deposition unit 200 may be fixed, but the reflection member RM and the irradiation unit 300 may be movable in the first direction DR1 after a deposition process is completed within the chamber 100. Alternatively, the reflection member RM may be fixed and only the deposition unit 200 may be movable in the first direction DR1.

However, the positions and movement relationships of the deposition unit 200, the reflection member RM and the irradiation unit 300 of the invention are not limited to a specific embodiment.

The mask cleaning apparatus 1000 according to the present embodiment may further include a guide substrate BS disposed outside the chamber 100. The guide substrate BS is disposed under the irradiation unit 300. In the present embodiment, the guide substrate BS is connected to the bottom portion 110 of the chamber 100 and is exposed outside the chamber 100. Alternatively, the guide substrate BS may not be connected to the chamber 100, but may still be exposed at an outside of the chamber 100.

The guide substrate BS includes at least one second guide rail (member) GR2 disposed or formed at a top surface of the guide substrate BS. In the present embodiment, two second guide rails GR2 are illustrated. However, embodiments of the invention are not limited to the number of the second guide rails GR2.

Each of the second guide rails GR2 lengthwise extends in the first direction DR1. The second guide rails GR2 are parallel to each other.

In the present embodiment, the second guide rail GR2 has an engraved shape formed by a recess that is recessed downward from the top surface of the guide substrate BS. However, embodiments of the invention are not limited to the shape of the second guide rail GR2. In other embodiments, the second guide rail GR2 may have an embossed shape formed by a protrusion that protrudes upward from the top surface of the guide substrate BS.

The irradiation unit 300 further includes at least one second moving member MM2 disposed on a bottom surface of the irradiation unit 300. The second moving member MM2 is engageable with the second guide rail GR2 to be movable relative thereto. In an exemplary embodiment, for example, the second moving member MM2 may include a wheel. The irradiation unit 300 may be movable in the first direction DR1 by the second moving member MM2. In the present embodiment, the second moving member MM2 may be provided in plurality, and the second moving members MM2 may be respectively engageable with the second guide rails GR2.

In other embodiments, the guide substrate BS may be omitted. In an exemplary embodiment, for example, the second guide rail GR2 may be disposed or formed at or in the one sidewall portion 130 of the chamber 100, which includes the transmission window WD. In more detail, the second guide rail GR2 may have a shape that is recessed inward from a side surface of the one sidewall portion 130 at which the transmission window WD is disposed. In this case, the second moving member MM2 may be disposed at a side surface of the irradiation unit 300, which faces the one sidewall portion 130 of the chamber 100, and the second moving member MM2 may be engageable with the second guide rail GR2 disposed or formed at the one sidewall portion 130. Thus, the irradiation unit 300 may be reciprocatable along the first direction DR1 relative to the second guide rail GR2 disposed at the one sidewall portion 130 of the chamber 100.

Figure 4:
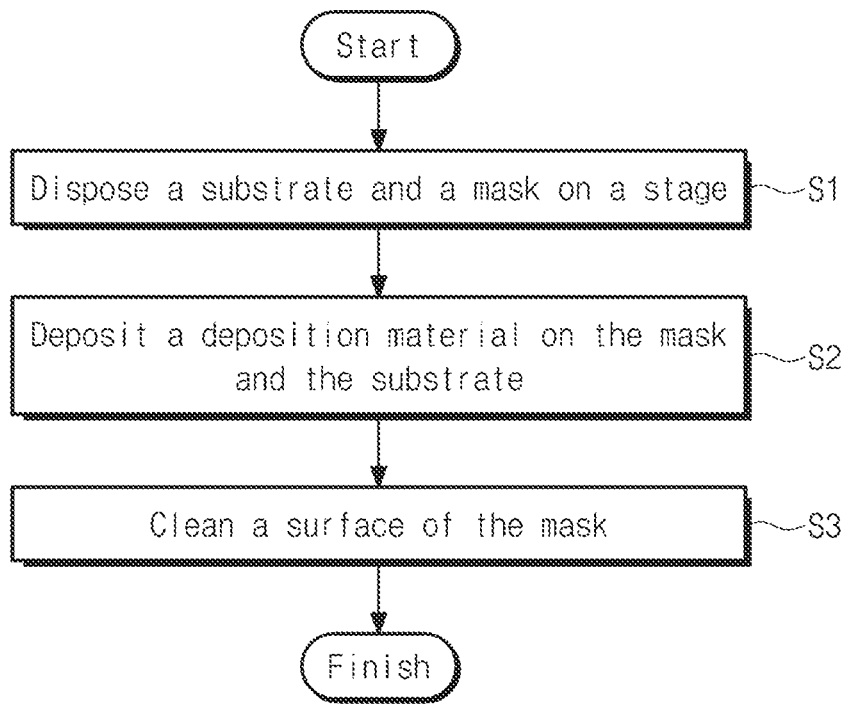
FIG. 4 is a flowchart illustrating an exemplary embodiment of a method of cleaning a mask, according to the invention.
Figure 5:
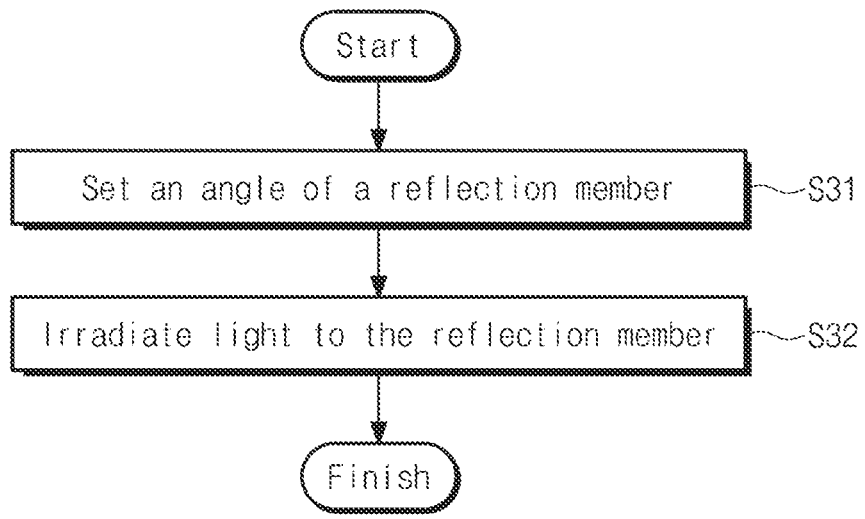
FIG. 5 is a flowchart illustrating an exemplary embodiment of a process of cleaning a surface of a mask, in the method of cleaning a mask, according to the invention.

FIG. 4 is a flowchart illustrating an exemplary embodiment of a method of cleaning a mask, according to the invention, and FIG. 5 is a flowchart illustrating an exemplary embodiment of a process cleaning a surface of a mask, within the method of cleaning a mask.

Referring further to FIGS. 4 and 5, the mask cleaning apparatus 1000 according to an embodiment of the invention may simultaneously perform a process of depositing the deposition material on the substrate SUB via the mask MSK and a process of cleaning the deposition material such as an organic material deposited on the mask MSK. That is, the apparatus 1000 may also be referred to as a material deposition and material cleaning apparatus or the like.

In more detail, referring to FIGS. 1 to 3 the substrate SUB and the mask MSK are sequentially disposed on the stage ST in the chamber 100 to deposit the deposition material on the substrate SUB via the mask MSK (S1). One or more hole or opening having a predetermined pattern may be defined in the mask MSK. A partial surface area of the substrate SUB may be exposed by the hole defined in the mask MSK. The exposed area of the substrate SUB is defined as a deposition area. The one or more hole or opening of the mask MSK, relative to solid portions thereof, may be otherwise referred to as a deposition pattern. Such deposition pattern of the mask MSK may correspond to a final material pattern to be formed on the substrate SUB.

Thereafter, within the chamber 100, the deposition material is deposited on the mask MSK and on the substrate SUB by using the deposition unit 200 (S2), in a deposition process. At this time, the deposition material may be deposited on the deposition area of the substrate SUB exposed by the mask MSK, and on the mask MSK such as on a non-opening or non-hole surface of the mask MSK (e.g., solid portions thereof). The deposition unit 200 may sequentially deposit the deposition material on each of the substrate SUB and the mask MSK while moving in the first direction DR1 along the substrate SUB.

Thereafter, once the deposition of the deposition material is completed, the surface of the mask MSK on which the deposition material has been disposed is cleaned (S3). If the deposition material deposited on the surface of the mask MSK by the deposition unit 200 in the deposition process is not removed, a boundary of the deposition area on the substrate SUB defined by the mask MSK may be unclear. If the boundary of the deposition area is unclear, a defect or failure of a device including a material pattern formed on the substrate SUB may occur when the mask MSK is reused in a subsequent deposition process. In the present embodiment, the deposition material deposited on the surface of the mask MSK in one deposition process may be cleaned to reduce a failure rate of the device formed on the substrate SUB by a subsequent deposition process using the same mask MSK.

As described above, the operation S3 of cleaning the surface of the mask MSK may be performed simultaneously in the chamber 100 with the operation S2 of depositing the deposition material. In more detail, since the deposition unit 200 and the reflection member RM are connected to each other along the first direction DR1 within the chamber 100, the deposition unit 200 and the reflection member RM may be movable together within the chamber 100 in the first direction DR1. Thus, the deposition unit 200 completing a first deposition at a first position (along the substrate SUB)

within the chamber 100 may be moved in the first direction DR1 to a second position (along the substrate SUB) within the chamber 100 different from the first position. Since the reflection member RM is movable together with the deposition unit 200, when the deposition unit 200 moves to the second position thereof, the reflection member RM may be moved closer to or to the first position at which the deposition unit 200 was previously disposed and may clean the surface of the mask MSK on which the first deposition has been completed. That is, the reflection member RM follows the deposition unit 200 in a direction in which deposition is performed, e.g., the first direction DR1.

According to the present embodiment, the following operations may be performed to clean the mask MSK. An angle of the reflection member RM is set (S31). The angle of the reflection member RM may be adjusted by or using the first angle adjustment unit AC1. An area size of an area of the mask MSK to which the laser beam is irradiated may be changed depending on the angle of the reflection member RM.

After the angle of the reflection member RM is set, the laser beam is irradiated to the reflection member RM set at a desired angle to clean the area of the mask MSK which has been previously deposited with the deposition material (S32). In more detail, the laser beam may be irradiated to the reflection member RM disposed in the chamber 100 by the irradiation unit 300 disposed outside the chamber 100. The irradiation unit 300 is disposed on the same line as (or is aligned with) the reflection member RM in the second direction DR2 and is moved in the first direction DR1 at the same speed as the reflection member RM.

In the chamber 100, the laser beam provided to the reflection member RS is reflected toward the mask MSK, and the reflected laser beam is provided to the mask MSK to remove the deposition material previously deposited on the surface of the mask MSK. A 'cleaning unit' of the material deposition and cleaning apparatus may include the irradiation unit 300 outside the chamber 100 and the reflection member RM inside the chamber 100.

According to the present embodiment, the mask MSK can be cleaned in the chamber 100 without moving the mask MSK from the inside of the chamber 100 to the outside of the chamber 100. The mask MSK can even be cleaned in the chamber 100 without moving the mask MSK within the chamber 100. Thus, since the mask MSK is cleaned without changing the vacuum state in the chamber 100, a process time and a process cost can be reduced. In addition, since the mask MSK does not need to be moved for the cleaning process, uniformity of alignment can be improved in the deposition process. In other words, the failure rate of the device formed on the substrate SUB can be reduced.

Figure 6:
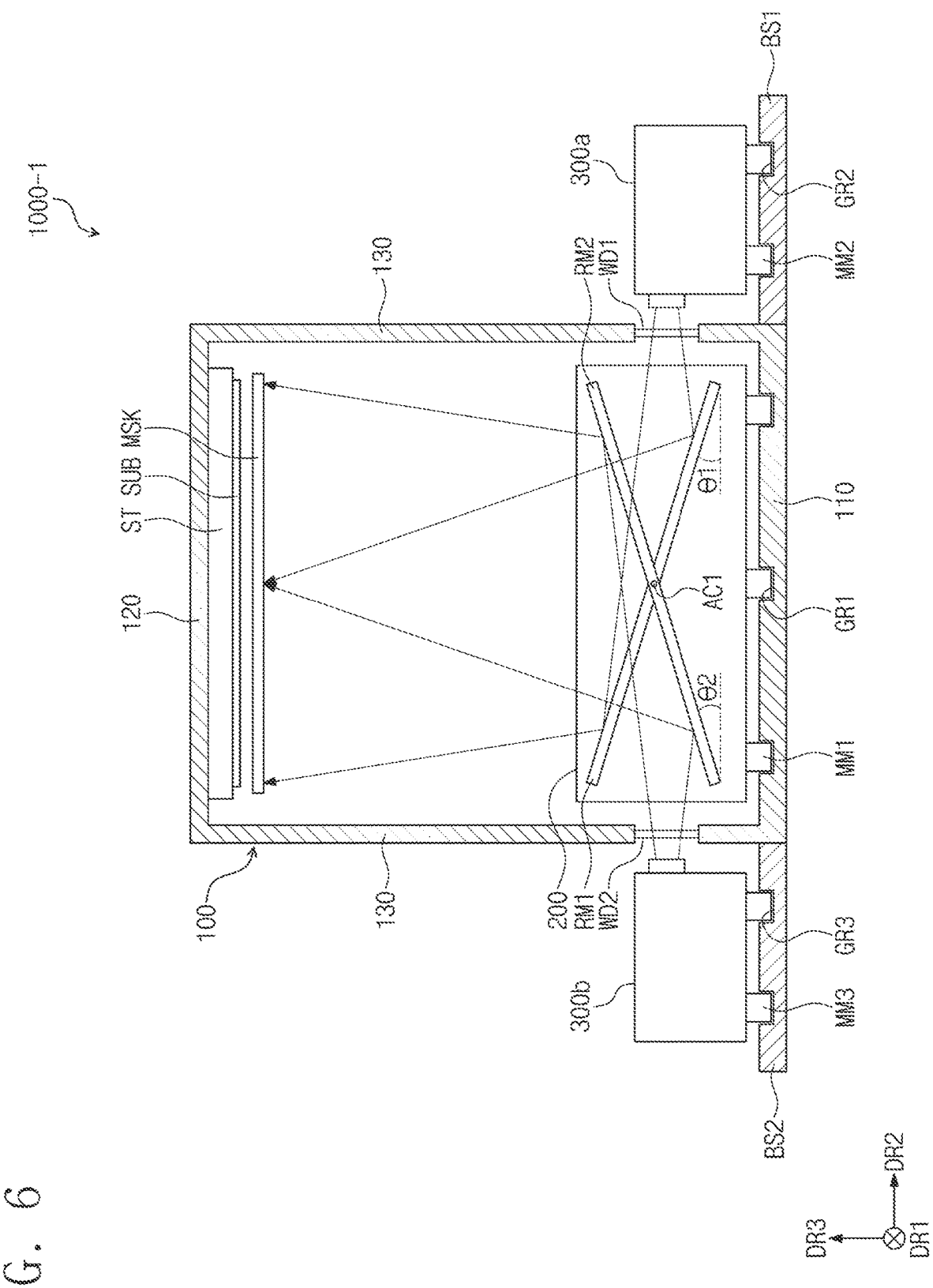
FIG. 6 is a front cross-sectional view illustrating another exemplary embodiment of an apparatus for cleaning a mask, according to the invention.
Figure 7:
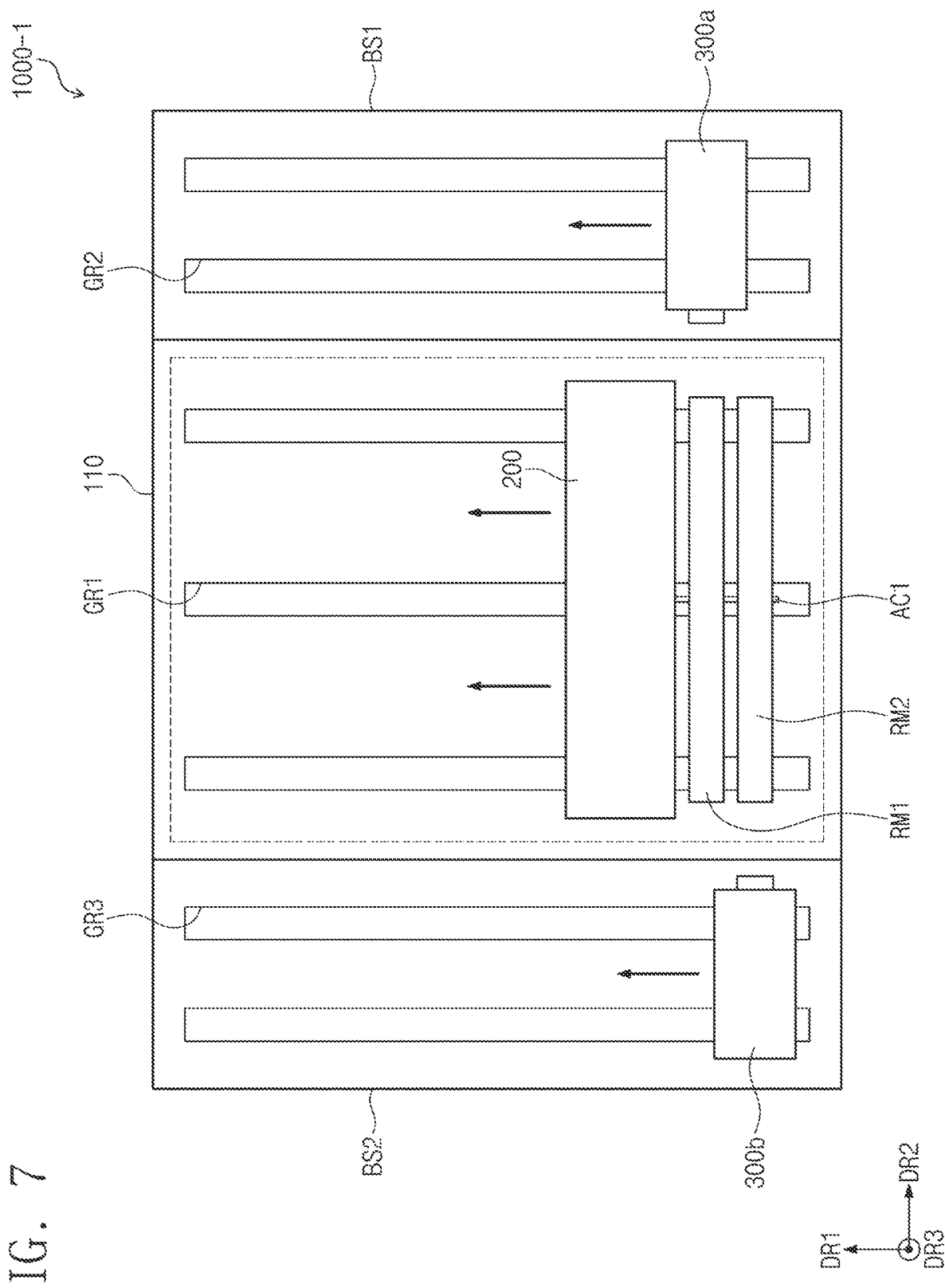
FIG. 7 is a top plan view illustrating the apparatus for cleaning a mask, which is illustrated in FIG. 6.

FIG. 6 is a front cross-sectional view illustrating another exemplary embodiment of an apparatus for cleaning a mask, according to the invention, and FIG. 7 is a top plan view illustrating the apparatus for cleaning a mask, which is illustrated in FIG. 6.

For the purpose of ease and convenience in description, differences between the present embodiment and the above embodiment will be mainly described and the same descriptions as in the above embodiment will be omitted. In addition, the same elements as described above will be indicated by the same reference numerals or the same reference designators, and the descriptions thereto will be omitted or mentioned briefly.

Referring to FIGS. 6 and 7, a mask cleaning apparatus 1000-1 according to another embodiment of the invention may include a plurality of irradiation units 300a and 300b.

In more detail, a first irradiation unit 300a is disposed adjacent to a first side of the chamber 100 in the second direction DR2, and a second irradiation unit 300b is disposed adjacent to a second side of the chamber 100 opposite to the first side thereof in the second direction DR2. The first irradiation unit 300a and the second irradiation unit 300b are opposite to each other in the second direction DR2.

The chamber 100 includes first and second transmission windows WD1 and WD2 which are disposed or formed in the sidewall portions 130 adjacent to the first and second irradiation units 300a and 300b, respectively. The first irradiation unit 300a generates and irradiates a laser beam through the first transmission window WD1, and the second irradiation unit 300b generates and irradiates a laser beam through the second transmission window WD2, into the inner space of the chamber 100 having the substrate SUB and the mask MSK therein.

According to the present embodiment, the mask cleaning apparatus 1000-1 may further include a plurality of reflection members RM1 and RM2. A first reflection member RM1 is connected to a side of the deposition unit 200 in the first direction DR1, and a second reflection member RM2 is connected to a side of the first reflection member RM1 in the first direction DR1 opposite to that at which the deposition unit 200 is disposed.

The first reflection member RM1 is disposed on the same line as (or is aligned with) the first irradiation unit 300a in the second direction DR2, and the second reflection member RM2 is disposed on the same line as (or is aligned with) the second irradiation unit 300b in the second direction DR2.

The first reflection member RM1 reflects the laser beam provided from the first irradiation unit 300a to provide the laser beam to at least a first partial area of the mask MSK. The second reflection member RM2 reflects the laser beam provided from the second irradiation unit 300b to provide the laser beam to a second partial area of the mask MSK different from the first partial area thereof. The first partial area of the mask MSK to which the laser beam is provided by the first reflection member RM1 may overlap with the second partial area of the mask MSK to which the laser beam is provided by the second reflection member RM2.

According to the present embodiment, a first angle $\theta 1$ at which the first reflection member RM1 is tilted may be different from a second angle $\theta 2$ at which the second reflection member RM2 is tilted. In an exemplary embodiment, for example, a size of the first angle $\theta 1$ may be equal to a size of the second angle $\theta 2$ and a direction of the first angle $\theta 1$ may be opposite to a direction of the second angle $\theta 2$.

According to the present embodiment, the mask cleaning apparatus 1000-1 may further include a first guide substrate BS1 and a second guide substrate BS2. The first guide substrate BS1 is disposed under the first irradiation unit 300a, and the second guide substrate BS2 is disposed under the second irradiation unit 300b.

The first guide substrate BS1 includes at least one second guide rail GR2, and the second guide substrate BS2 includes at least one third guide rail (member) GR3. Each of the second and third guide rails GR2 and GR3 lengthwise extends in the first direction DR1.

The first irradiation unit 300a includes at least one second moving member MM2, and the second irradiation unit 300b includes at least one third moving member MM3. The second moving member MM2 and the third moving member MM3 are engageable with the second guide rail GR2 and the third guide rail GR3, respectively, to be moveable relative thereto.

Figure 8:
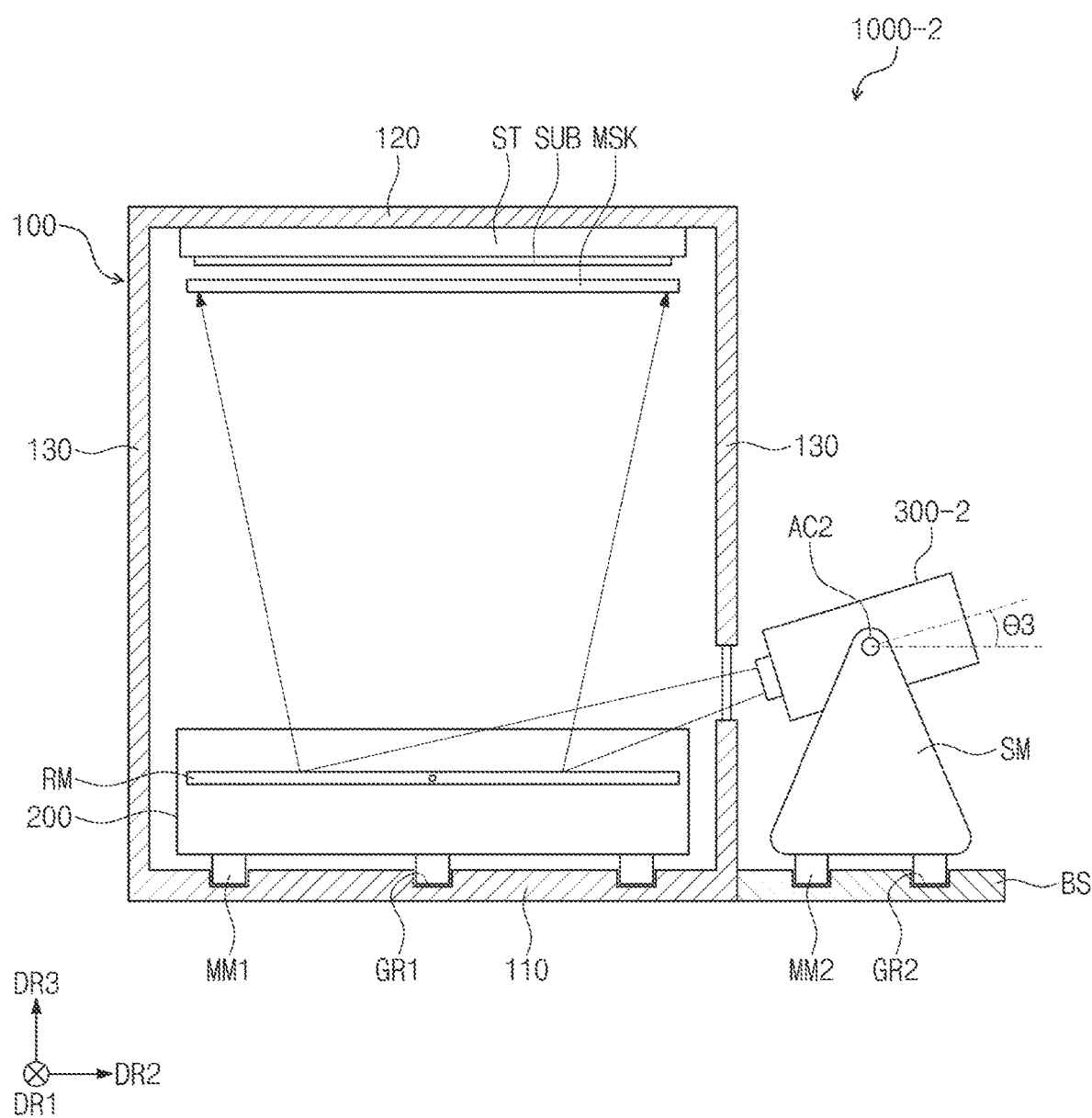
FIG. 8 is a front cross-sectional view illustrating still another exemplary embodiment of an apparatus for cleaning a mask, according to the invention.
Figure 9:
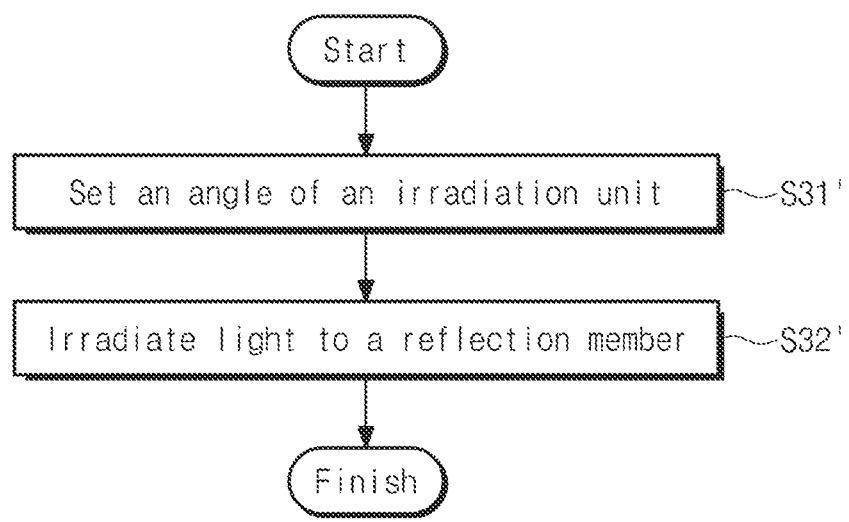
FIG. 9 is a flowchart illustrating another exemplary embodiment of a method of cleaning a mask, by using the apparatus for cleaning a mask in FIG. 8, according to the invention.

FIG. 8 is a front cross-sectional view illustrating still another exemplary embodiment of an apparatus for cleaning a mask, according to the invention, and FIG. 9 is a flowchart illustrating an exemplary embodiment of a method of cleaning a mask by using the apparatus for cleaning a mask in FIG. 8, according to the invention.

For the purpose of ease and convenience in description, differences between the present embodiment and the above embodiments will be mainly described and the same descriptions as in the above embodiments will be omitted. In addition, the same elements as described above will be indicated by the same reference numerals or the same reference designators, and the descriptions thereto will be omitted or mentioned briefly.

Referring to FIGS. 8 and 9, a mask cleaning apparatus 1000-2 according to still another embodiment of the invention may further include a support member SM and a second angle adjustment unit AC2.

The support member SM is disposed on the guide substrate BS outside the chamber 100 to support an irradiation unit 300-2 outside the chamber 100. A second moving member MM2 movable together with the irradiation unit 300-2 is disposed on a bottom surface of the support member SM such that the irradiation unit 300-2 is movable in the first direction DR1.

The second angle adjustment unit AC2 connects the support member SM and the irradiation unit 300-2 to each other. The irradiation unit 300-2 may be rotated about the second angle adjustment unit AC2. According to the present embodiment, the irradiation unit 300-2 forms a third angle θ3 with a plane parallel to that in which the guide substrate BS is disposed. Thus, in a cleaning process of the mask MSK, the third angle θ3 of the irradiation unit 300-2 may be set (S31'), and then, a laser beam may be irradiated to the reflection member RM set at the third angle θ3 (S32').

According to the present embodiment, it is possible to easily control the direction of the laser beam provided to the reflection member RM.

Figure 10:
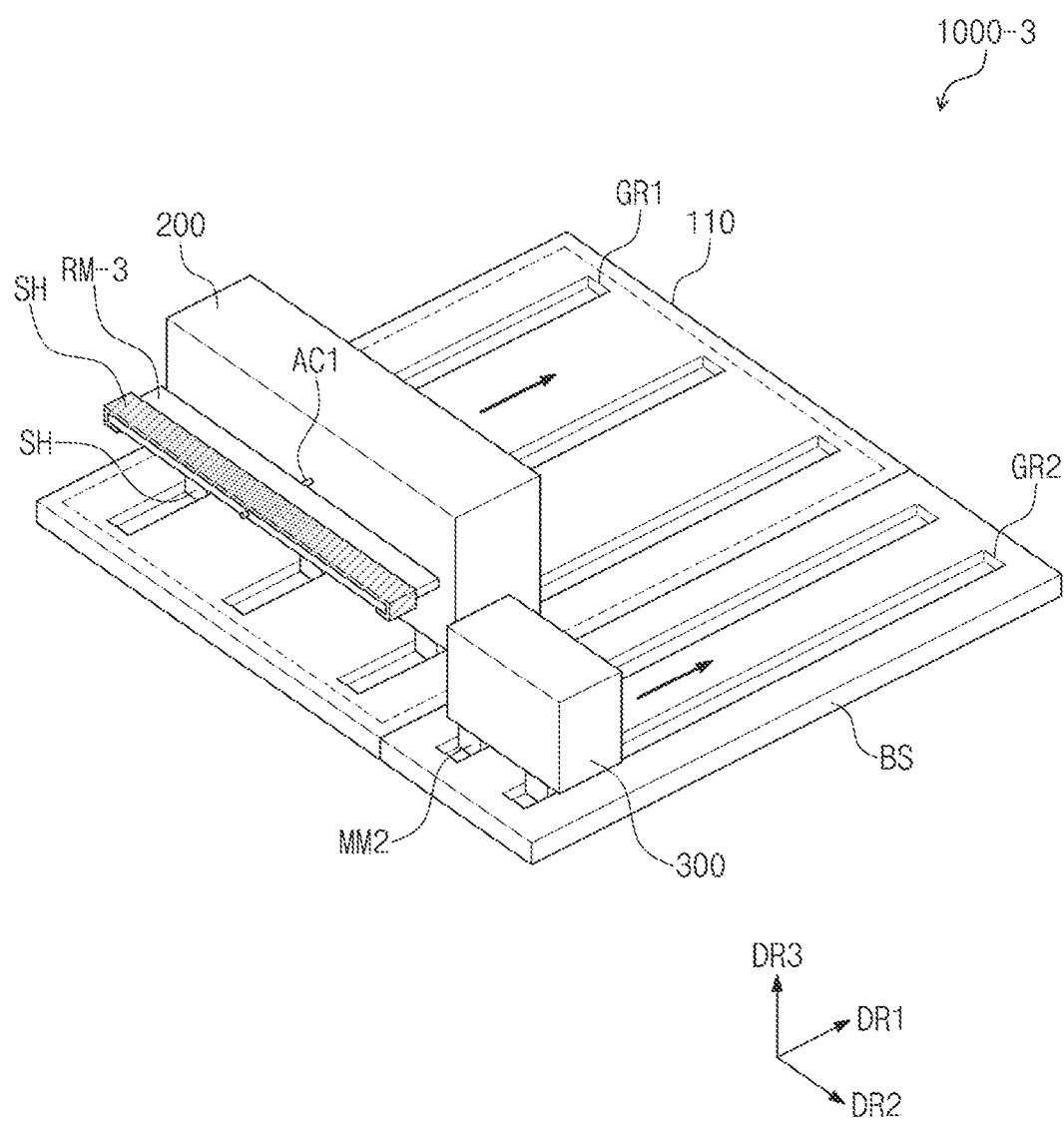
FIG. 10 is a perspective view illustrating yet another exemplary embodiment of an apparatus for cleaning a mask, from which illustration of a sidewall portion of a chamber is omitted, according to the invention.
Figure 11:
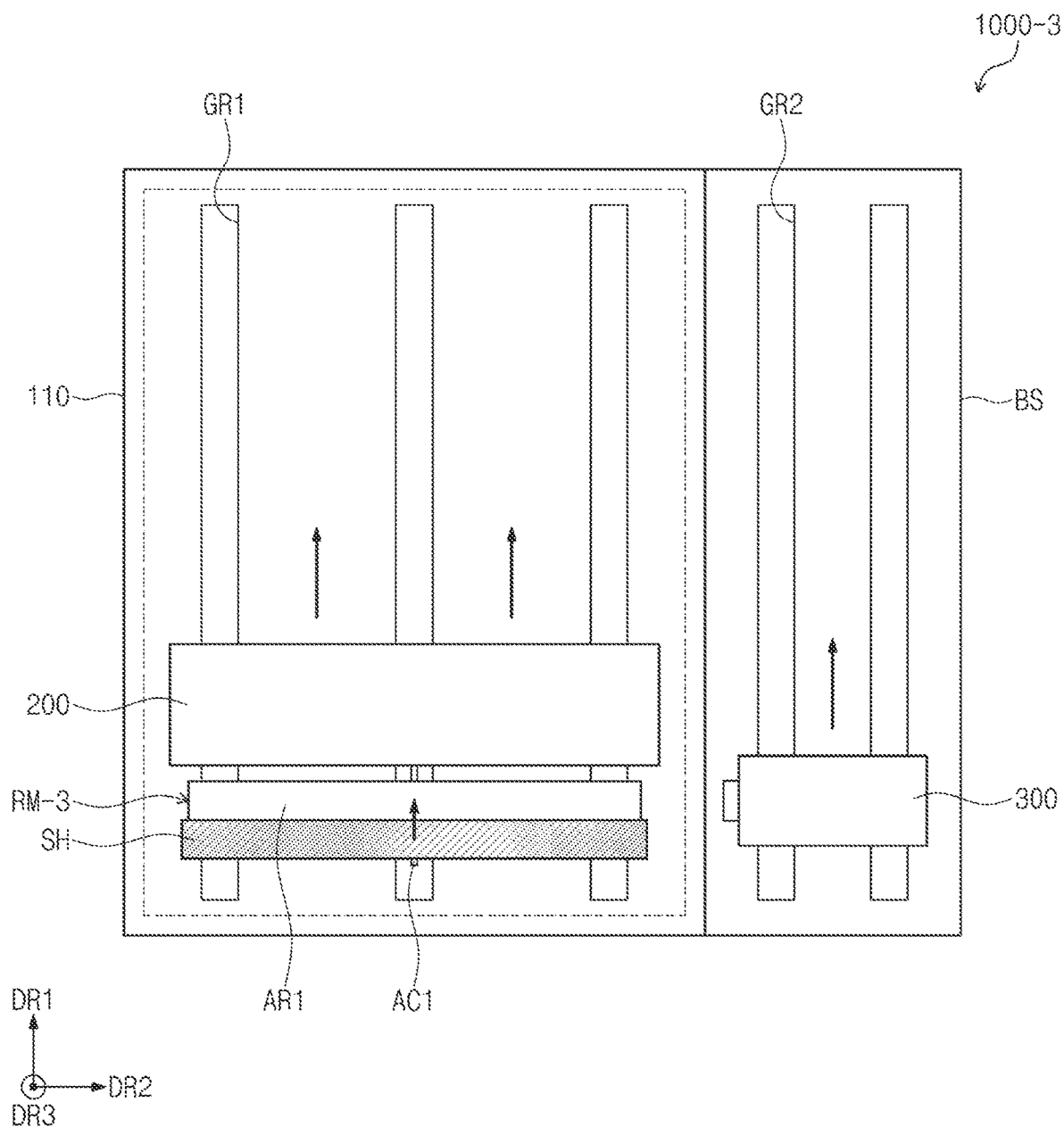
FIGS. 11 and 12 are top plan views illustrating the apparatus for cleaning a mask, which is illustrated in FIG. 10.
Figure 12:
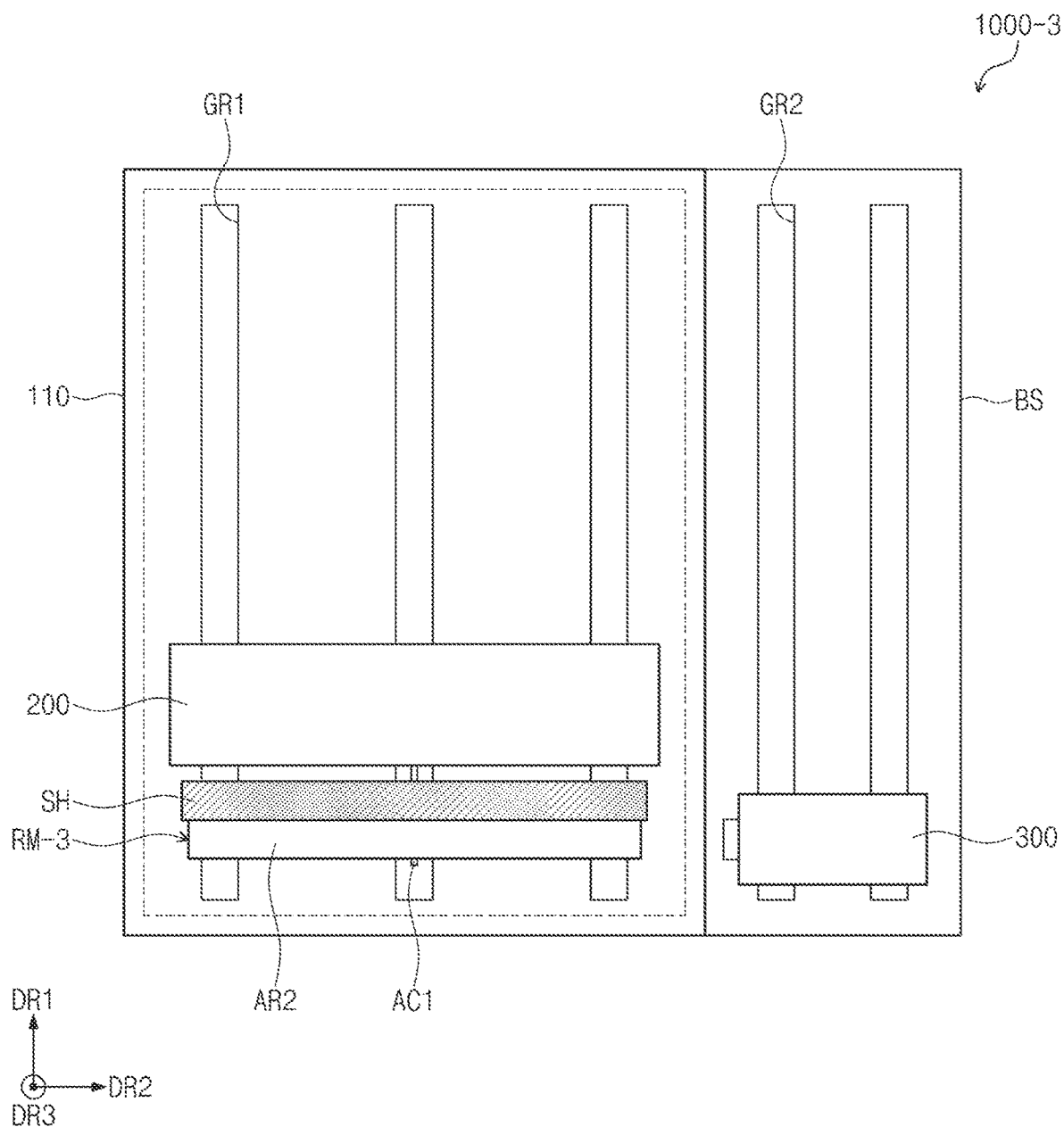

FIG. 10 is a perspective view illustrating yet another exemplary embodiment of an apparatus for cleaning a mask, from which illustration of a sidewall portion of a chamber is omitted, according to the invention, and FIGS. 11 and 12 are top plan views illustrating the apparatus for cleaning a mask, which is illustrated in FIG. 10.

For the purpose of ease and convenience in description, differences between the present embodiment and the above embodiments will be mainly described and the same descriptions as in the above embodiments will be omitted. In addition, the same elements as described above will be indicated by the same reference numerals or the same reference designators, and the descriptions thereto will be omitted or mentioned briefly.

Referring to FIGS. 10 to 12, a mask cleaning apparatus 1000-3 according to yet another embodiment of the invention may further include a shutter SH. The shutter SH may be disposed on a reflection member RM-3 to cover a partial area of a top surface of the reflection member RM-3 while exposing another partial area of the top surface. The shutter SH may be movable relative to the reflection member RM-3 to reciprocate in the first direction DR1 on the reflection member RM-3. A total planar area of the reflection member RM-3 according to the present embodiment may be greater than a total planar area of the reflection member RM according to the aforementioned embodiments.

In more detail, the top surface of the reflection member RM includes or is defined by a first area AR1 and a second area AR2. The first area AR1 and the second area AR2 are arranged in the first direction DR1.

In a first cleaning process, the shutter SH covers the second area AR2 of the reflection member RM-3 in the first direction DR1. In other words, the first area AR1 of the reflection member RM-3 may be exposed by the shutter SH covering the second area AR2. Thus, the laser beam irradiated from the irradiation unit 300 is provided to the first area AR1.

In a second cleaning process, the shutter SH is moved in the first direction DR1 to cover the first area AR1 of the reflection member RM-3. In other words, the second area AR2 of the reflection member RM-3 may be exposed by the shutter SH covering the first area AR1. Thus, the laser beam irradiated from the irradiation unit 300 is provided to the second area AR2.

Embodiments of the invention are not limited to the number and the positions of the areas, covered by the shutter SH, of the reflection member RM-3. In other embodiments, for example, three or more areas may be defined for the top surface of the reflection member RM-3, and the shutter SH may expose a portion of one area while covering the remaining areas except for the exposed one area. Alternatively, in still other embodiments, a plurality of areas may be arranged in the second direction DR2 for the top surface of the reflection member RM-3, and the shutter SH may reciprocate in the second direction DR2.

In a conventional apparatus for cleaning a mask, if the shutter SH does not cover a partial area of the reflection member RM-3 unlike the present embodiment, the deposition material may be deposited on an entire top surface of the reflection member RM-3. In this case, when a plurality of cleaning processes is performed, a reflection direction of the laser beam may be non-uniform by the deposition material deposited on an entire top surface of the reflection member RM-3 since there is no portion of the top surface which is not covered with deposition material. However, according to one or more embodiment of the invention, the shutter SH may prevent the deposition material from being deposited on the entire top surface of the reflection member RM-3, and thus it is possible to reduce or minimize the phenomenon that the reflection direction of the laser beam is non-uniform in a plurality of cleaning processes. In other words, the cleaning process may be effectively performed.

According to one or more embodiment of the invention, the mask cleaning apparatus provides a reduced process time for cleaning a deposition mask. In addition, one or more embodiment of the mask cleaning apparatus provides a reduction in the process cost and the process failure rate.

While the invention has been described with reference to example embodiments, it will be apparent to those skilled in the art that various changes and modifications may be made without departing from the spirits and scope of the invention. Therefore, it should be understood that the above embodiments are not limiting, but illustrative. Thus, the scope of the invention are to be determined by the broadest permissible interpretation of the following claims and their equivalents, and shall not be restricted or limited by the foregoing description.

What is claimed is:

1. A method of cleaning a deposition mask, the method comprising:
   disposing a substrate and a mask on a stage within a chamber in which material deposition is performable on the substrate using the mask, the chamber comprising a bottom portion including a first guide rail extending along a first direction in the chamber;

depositing a deposition material on an area of a top surface of the substrate which is exposed by the mask and on a top surface of the mask, the depositing of the deposition material comprising a deposition unit in the chamber and providing the deposition material; and reflecting light provided into the chamber from an irradiation unit disposed outside the chamber, through a reflection member connected to the deposition unit and reciprocally movable along the first guide rail, in the chamber, the reflection member providing the light to the top surface of the mask to clean the deposition material from the top surface of the mask, wherein the depositing of the deposition material and the cleaning of the deposition material are each performed in a vacuum state within the chamber.

2. The method of claim 1, wherein the depositing of the deposition material on the mask and the cleaning of the deposition material from the mask are performed simultaneously within the chamber.

3. The method of claim 1, wherein
the cleaning of the deposition material comprises:
  setting an angle of the reflection member which is connected to the deposition unit; and
  providing the light onto the reflection member at the angle, within the chamber, from the irradiation unit disposed outside the chamber; and
  the reflection member which is at the angle reflecting the light provided thereto from the irradiation unit disposed outside the chamber to the mask within the chamber.

4. The method of claim 1, wherein
the cleaning of the deposition material comprises:
  setting a direction of the light which will be provided from the irradiation unit disposed outside the chamber; and
  providing the light from the irradiation unit outside the chamber onto the reflection member which is connected to the deposition unit; and
  the reflection member reflecting the light which is at the angle and provided thereto from the irradiation unit disposed outside the chamber to the mask within the chamber.

* * * * *